United States Patent [19]
Kuriyama

[11] Patent Number: 5,929,712
[45] Date of Patent: Jul. 27, 1999

[54] PHASE LOCKED LOOP HAVING FREQUENCY DIVIDER COUPLED TO STUB ON VCO

[75] Inventor: Yasuhiko Kuriyama, Yokohama, Japan

[73] Assignee: Kabushiki Kaisha Toshiba, Kawasaki, Japan

[21] Appl. No.: 09/037,033

[22] Filed: Mar. 9, 1998

[30] Foreign Application Priority Data

Mar. 14, 1997 [JP] Japan ................................. 9-061390

[51] Int. Cl.⁶ .............................. H03B 5/18; H03L 7/18
[52] U.S. Cl. .................... 331/25; 331/99; 331/117 D; 331/177 V
[58] Field of Search .................. 331/25, 96, 99, 331/107 SL, 117 D, 36 C, 177 V

[56] References Cited

U.S. PATENT DOCUMENTS

| 4,619,001 | 10/1986 | Kane ......................................... 331/25 |
| 5,130,675 | 7/1992 | Sugawara ............................. 331/117 D |
| 5,565,821 | 10/1996 | Murtojarvi ........................... 331/117 D |

OTHER PUBLICATIONS

P. Leber, et al., "A Completely Integrated Single–Chip Phase–Locked Loop with a 15 GHz VCO Using 0.2–μm E-/D–HEMT–Technology", IEEE GaAs IC Symposium, 1996, pp. 85–88.

B. Razavi, et al., "A 6 GHz 60 mW BiCMOS Phase–Locked Loop", IEEE Journal of Solid–State Circuits, vol. 29, No. 12, Dec. 1994, pp. 1560–1565.

U. Guettich, et al., "Ka–Band Monolithic–VCOs for Low Noise Applications Using GaInP/GaAs HBTs", IEEE 1994 Microwave and Millimeter–Wave Monolithic Circuits Symposium, pp. 165–168.

*Primary Examiner*—Siegfried H. Grimm
*Attorney, Agent, or Firm*—Oblon, Spivak, McClelland, Maier & Neustadt, P.C.

[57] ABSTRACT

A phase locked loop includes a voltage controlled oscillator, a frequency divider for frequency-dividing an output from the voltage controlled oscillator, a phase comparator for comparing an output from the frequency divider with a phase of a reference signal, and a control circuit for controlling the oscillator frequency of the voltage controlled oscillator on the basis of an output from the phase comparator. The voltage controlled oscillator and the frequency divider are formed within a single integrated circuit chip, and the input terminal of the frequency divider is connected to a short stub having an open end connected to the voltage controlled oscillator.

14 Claims, 5 Drawing Sheets

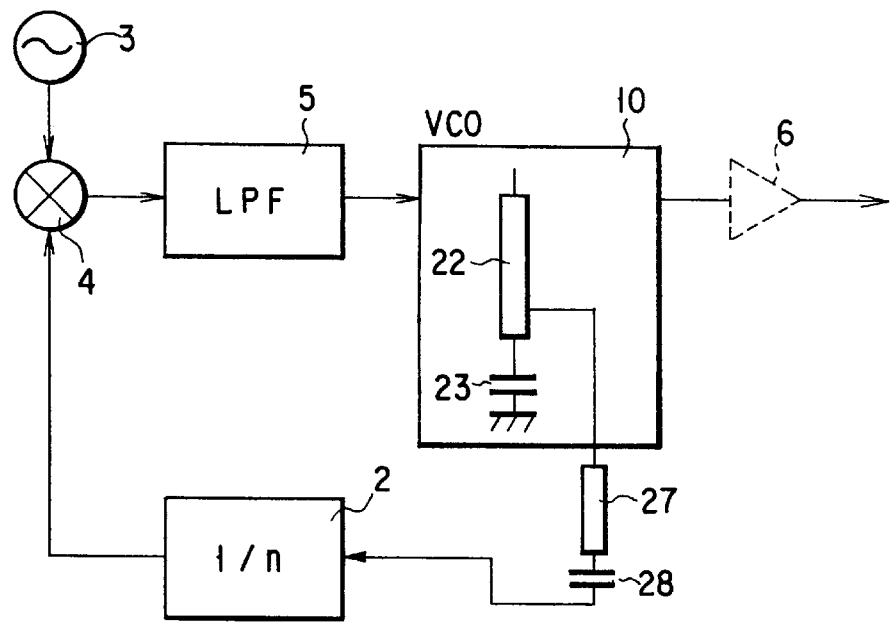
F I G. 3A
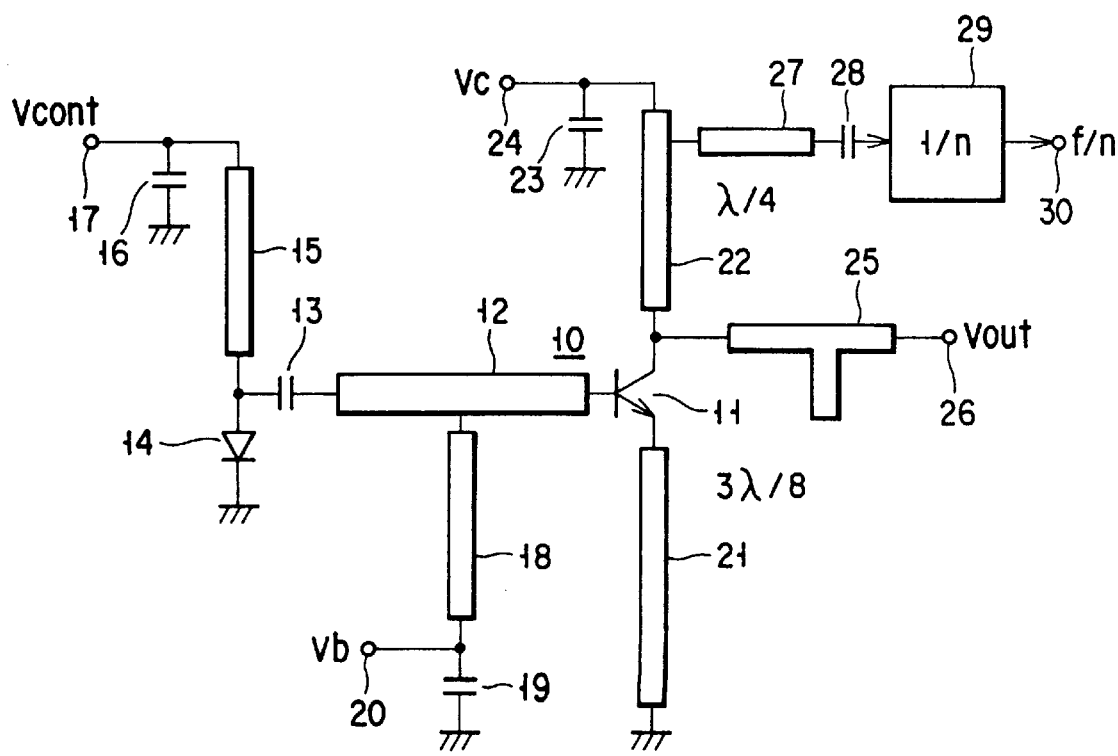
F I G. 3B

PHASE LOCKED LOOP HAVING FREQUENCY DIVIDER COUPLED TO STUB ON VCO

BACKGROUND OF THE INVENTION

The present invention relates to a phase locking apparatus and, more particularly, to a phase locking apparatus suitably applied to a synthesizer for synthesizing frequencies over the GHz band.

In general, a phase locking circuit is often used as a synthesizer for synthesizing an arbitrary frequency by using a voltage controlled oscillator, with the frequency of a reference oscillator serving as a reference, in various communication devices.

FIG. 1 shows a phase locking circuit formed as a synthesizer.

Referring to FIG. 1, a phase comparator 4 compares an output from a frequency divider 2 for frequency-dividing an output from a voltage controlled oscillator 1 into 1/n with an output from a high-precision reference oscillator 3, and outputs a signal corresponding to the phase difference between the output from the frequency divider 2 and the output from the reference oscillator 3.

The signal corresponding to the phase difference is supplied as a control voltage to the voltage controlled oscillator 1 through a low-pass filter 5.

In this case, a signal having a frequency n·f determined by an oscillation frequency f of the reference oscillator 3 and a frequency division ratio n is obtained from the output from the voltage controlled oscillator 1. Note that the output from the voltage controlled oscillator 1 may be extracted through a buffer amplifier 6, as indicated by the dashed line.

When such a phase locking circuit is to be formed into an MIC (Microwave Integrated Circuit), the voltage controlled oscillator 1 and the frequency divider 2 are formed by different integrated circuit chips to be optimized to prevent the characteristics of these components from affecting each other. The output power of the voltage controlled oscillator 1 is divided into two components. One component is guided to the output side, and the other component is input to the frequency divider 2.

With this arrangement, in a phase locking circuit which operates at a high frequency in the GHz band or higher, in particular, an output from an voltage controlled oscillator 1 is distributed to the output side and a frequency divider 2 through a hybrid circuit 7 or power divider, and power matching is performed on the input side of the frequency divider 2, as shown in FIG. 2.

In this arrangement, however, the output power of the voltage controlled oscillator 1 must be set to be larger than that actually required as an output by the power component input to the input terminal of the frequency divider 2, resulting in a decrease in efficiency.

In addition, if the hybrid circuit 7 is used as an element for distributing an output from the voltage controlled oscillator 1 to the output side and the frequency divider 2, the element size becomes large. If a power divider is used, the power loss increases. As a result, the output power of the voltage controlled oscillator 1 must be further increased.

That is, in the conventional phase locking apparatus, since the output power of the voltage controlled oscillator must be distributed to both the output side and the frequency divider, the output power must be set to be large. If a hybrid circuit is used for power distribution, the element size increases. If a power divider is used, the power loss increases.

BRIEF SUMMARY OF THE INVENTION

The present invention has been made in consideration of the above situation, and has as its object to provide a phase locking apparatus which can reduce the output power of a voltage controlled oscillator while maintaining high performance.

In order to achieve the above object, according to the first aspect of the present invention, there is provided a phase locking apparatus comprising:

a voltage controlled oscillator;

a frequency divider for frequency-dividing an output from the voltage controlled oscillator;

a phase comparator for comparing an output from the frequency divider with a phase of a reference signal; and control means for controlling an oscillator frequency of the voltage controlled oscillator on the basis of an output from the phase comparator, wherein the voltage controlled oscillator and the frequency divider are formed within a single integrated circuit chip, and an input terminal of the frequency divider is connected to a short stub having an open end connected to the voltage controlled oscillator.

According to the second aspect of the present invention, there is provided a phase locking apparatus according to the first aspect, further comprising a buffer amplifier for amplifying an output from the voltage controlled oscillator, wherein the short stub is a short stub for applying a bias to the buffer amplifier.

According to the third aspect of the present invention, there is provided a phase locking apparatus according to the first aspect, wherein the input terminal of the frequency divider is connected at a distance of not more than $\lambda/8$ from a short end of the short stub when a wavelength at an oscillation center frequency of the voltage controlled oscillator is represented by $\lambda$.

According to the fourth aspect of the present invention, there is provided a phase locking apparatus according to the first aspect, wherein the short stub is grounded through a capacitor.

According to the fifth aspect of the present invention, there is provided a phase locking apparatus according to first aspect, wherein the short stub has a length of $\lambda/4$ when a wavelength at an oscillation center frequency of the voltage controlled oscillator is represented by $\lambda$.

According to the sixth aspect of the present invention, there is provided a phase locking apparatus according to the first aspect, further comprising a capacitor for cutting off a DC component of an output from the voltage controlled oscillator.

According to the seventh aspect of the present invention, there is provided a phase locking apparatus according to the first aspect, wherein the short stub has a length of $3\lambda/8$ when a wavelength at an oscillation center frequency of the voltage controlled oscillator is represented by $\lambda$.

According to the eighth aspect of the present invention, there is provided a phase locking apparatus comprising:

a voltage controlled oscillator;

a frequency divider for frequency-dividing an output from the voltage controlled oscillator;

a phase comparator for comparing an output from the frequency divider with a phase of a reference signal; and control means for controlling an oscillator frequency of the voltage controlled oscillator on the basis of an output from the phase comparator, wherein the voltage controlled oscillator and the frequency divider are formed within a single integrated circuit chip, and are connected to the voltage controlled oscillator through a first inductance element.

According to the ninth aspect of the present invention, there is provided a phase locking apparatus according to the eighth aspect, further comprising a transmission line having one end connected to the first inductance element and the other end grounded.

According to the 10th aspect of the present invention, there is provided a phase locking apparatus according to the ninth aspect, wherein the other end of the transmission line is grounded through a DC blocking capacitor.

According to the 11th aspect of the present invention, there is provided a phase locking apparatus according to the ninth aspect, wherein the transmission line has a length of not more than $\lambda/8$ when a wavelength at an oscillation center frequency of the voltage controlled oscillator is represented by $\lambda$.

According to the 12th aspect of the present invention, there is provided a phase locking apparatus according to the eighth aspect, further comprising a capacitor for cutting off a DC component of an output from the voltage controlled oscillator.

According to the 13th aspect of the present invention, there is provided a phase locking apparatus according to the eighth aspect, further comprising a second inductance element having one end connected to the first inductance element and the other end grounded.

According to the 14th aspect of the present invention, there is provided a phase locking apparatus comprising:

a voltage controlled oscillator;

a frequency divider for frequency-dividing an output from the voltage controlled oscillator;

a phase comparator for comparing an output from the frequency divider with a phase of a reference signal; and control means for controlling an oscillator frequency of the voltage controlled oscillator on the basis of an output from the phase comparator, wherein the voltage controlled oscillator and the frequency divider are formed within a single integrated circuit chip, and an input terminal of the frequency divider is connected to a position at which variations in impedance on the frequency divider side are suppressed when viewed from an amplifier of the voltage controlled oscillator.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a block diagram showing a phase locking apparatus according to an embodiment of the present invention;

FIG. 3B is a view showing a voltage controlled oscillator and a frequency divider in the phase locking apparatus according to the first embodiment of the present invention;

DETAILED DESCRIPTION OF THE INVENTION

Figure 1:
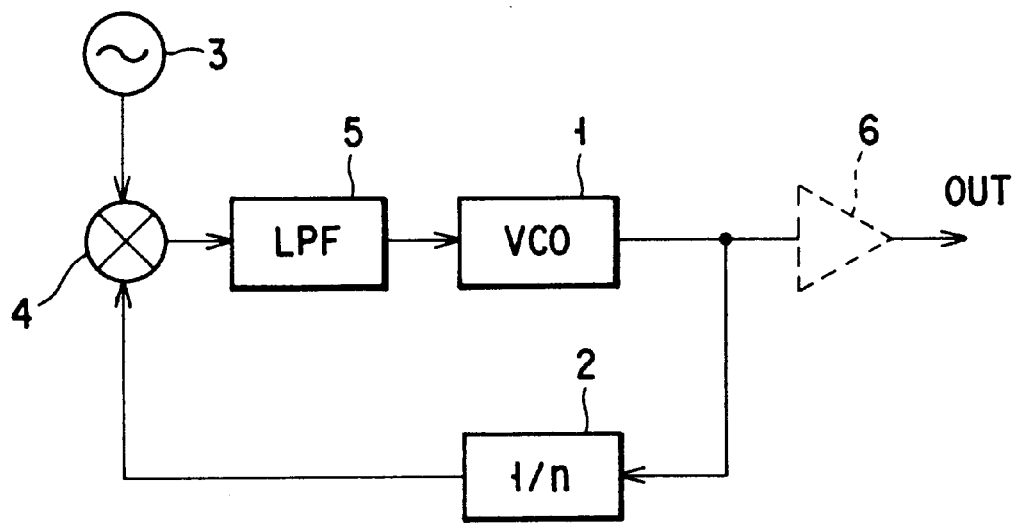
FIG. 1 is a block diagram showing the basic arrangement of a conventional phase locking circuit.
Figure 2:
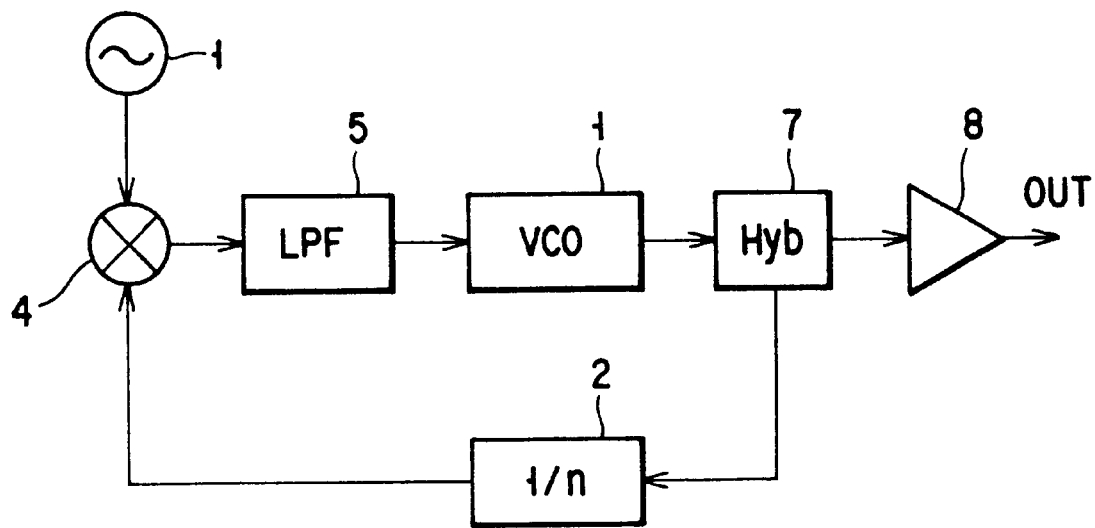
FIG. 2 is a block diagram showing the arrangement of a conventional high-frequency phase locking circuit.

Embodiments of the present invention will be described below with reference to the accompanying drawing.

First Embodiment

FIG. 3A is a block diagram showing a phase locking apparatus according to the first embodiment of the present invention.

As shown in FIG. 3A, a phase comparator 4 compares an output from a frequency divider 2 for frequency-dividing an output from a voltage controlled oscillator 10 into 1/n with an output from a high-precision reference oscillator 3, and outputs a signal corresponding to the phase difference between the output from the frequency divider 2 and the output from the reference oscillator 3.

The signal corresponding to the phase difference is supplied as a control voltage to the voltage controlled oscillator 10 through a low-pass filter 5.

In this case, a signal having a frequency n·f determined by an oscillation frequency f of the reference oscillator 3 and a frequency division ratio n is obtained from the output from the voltage controlled oscillator 10. In addition, the input terminal of the frequency divider 2 is connected to a portion near the short end of a collector bias application short stub 22 of the voltage controlled oscillator 10 through a transmission line 27 and a DC blocking capacitor 28. Note that the output from the voltage controlled oscillator 10 may be extracted through a buffer amplifier 6, as indicated by the dashed line.

FIG. 3B shows a voltage controlled oscillator (to be referred to as a VCO hereinafter), a frequency divider, and their peripheral portions of a phase locking apparatus according to an embodiment of the present invention.

In this phase locking apparatus, at least the VCO and frequency divider are formed in a single microwave integrated circuit (MIC) chip. The MIC is an integrated circuit formed by mounting monolithic ICs, transmission lines, various discrete elements, and the like, which constitute a circuit, on a single dielectric substrate.

Referring to FIGS. 3A and 3B, a VCO 10 is a series feedback oscillator mainly constituted by a transistor 11, an inductive transmission line 12 having one end connected to the base of the transistor 11, and a varactor diode 14 connected to the other end of the transmission line 12 through a DC blocking capacitor 13. The transmission line 12 and the varactor diode 14 constitute a resonator.

The cathode of the varactor diode 14 is grounded. The anode of the varactor diode 14 is connected to the open end of a varactor bias application short stub 15. For example, letting $\lambda$ be the wavelength at the oscillation center frequency of the VCO 10, the length of the varactor bias application short stub 15 is set to $\lambda/4$.

The short end of the varactor bias application short stub 15 is grounded through a ground capacitor 16 and also connected to a control voltage input terminal 17. A control voltage Vcont output from the low-pass filter 5 in FIGS. 3A and 3B is input to the control voltage input terminal 17.

The electrostatic capacitance of the varactor diode 14 changes in accordance with the control voltage Vcont, and the oscillation frequency of the VCO 10 changes.

A base bias voltage Vb is applied to the base of the transistor 11 through a portion of the transmission line 12 and a base bias application short stub 18. For example, the length of the base bias application short stub 18 is also set to $\lambda/4$.

The open end of the base bias application short stub 18 is connected midway along the transmission line 12. The short end of the base bias application short stub 18 is grounded through a ground capacitor 19, and also connected to a base bias power supply terminal 20.

The emitter of the transistor 11 is grounded through a capacitive short stub 21 to increase the negative resistance of the transistor 11. For example, the length of the capacitive short stub 21 is set to $3\lambda/8$.

A collector bias voltage Vc is applied to the collector of the transistor 11 through the collector bias application short stub 22. For example, the length of the collector bias application short stub 22 is also set to $\lambda/4$.

The open end of the collector bias application short stub 22 is connected to the collector of the transistor 11. The short end of the collector bias application short stub 22 is grounded through a ground capacitor 23, and also connected to a collector bias power supply terminal 24.

The collector of the transistor 11 is connected to an output terminal 26 through a transmission line 25 for extracting an output from the VCO 10. An output Vout from the VCO 10 is extracted from this output terminal 26.

The input terminal of a frequency divider 29 is connected to a portion near the short end of the collector bias application short stub 22 through the transmission line 27 and the DC blocking capacitor 28. A signal having a frequency f/n which is 1/n of an oscillation frequency f of the VCO 10 is extracted from an output terminal 30 of the frequency divider 29. For example, the DC blocking capacitor 28 is constituted by an MIM capacitor.

In this case, the position at which the input terminal of the frequency divider 29 is connected to the collector bias application short stub 22 through the transmission line 27 and the DC blocking capacitor 28 is preferably as near the short end as possible within the range in which a signal voltage high enough to operate the frequency divider 29 appears. More specifically, letting $\lambda$ be the wavelength at the oscillation center frequency of the voltage controlled oscillator, the position is preferably set at a distance of $\lambda/8$ or less from the short end.

In other words, the input terminal of the frequency divider is preferably connected to a position at which the impedance at the oscillation frequency does not greatly vary when viewed from the collector terminal of the transistor of the voltage controlled oscillator even if the connected frequency divider has an arbitrary impedance.

The frequency divider 29 is a two-stage frequency divider constituted by, for example, a dynamic frequency divider on the first stage and a master/slave type static frequency divider on the second stage. The frequency divider 29 frequency-divides an output from the VCO 10 by ¼.

Figure 4:
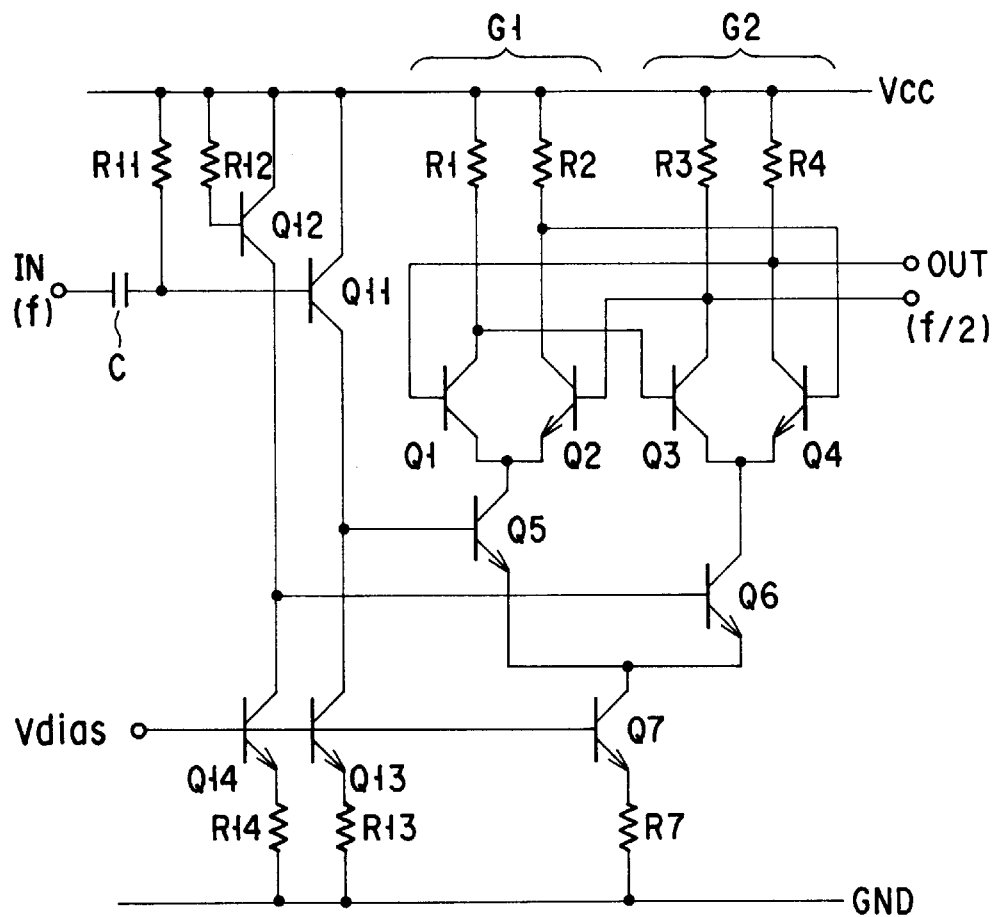
FIG. 4 is a circuit diagram showing a dynamic frequency divider used on the first stage of a frequency divider in the first embodiment.

FIG. 4 shows an example of the dynamic frequency divider on the first stage. This dynamic frequency divider is a ½ frequency divider having a ring oscillator arrangement using two fundamental gates constituted by a pair of emitter-coupled differential transistors.

More specifically, a first fundamental gate G1 is constituted by a pair of first emitter-coupled differential transistors Q1 and Q2 having resistors R1 and R2 as collector loads. Similarly, the second fundamental gate G2 is constituted by a pair of second emitter-coupled differential transistors Q3 and Q4 having resistors R3 and R4 as collector loads.

Collector outputs from the pair of emitter-coupled differential transistors Q3 and Q4 of the second fundamental gate G2 are fed back to the bases of the pair of emitter-coupled differential transistors Q1 and Q2 of the first fundamental gate G1. With this operation, the phases of the signals are inverted one period.

The common emitters of the first pair of emitter-coupled differential transistors Q1 and Q2 and the second pair of emitter-coupled differential transistors Q3 and Q4 are respectively connected to the collectors of a third pair of emitter-coupled differential transistors Q5 and Q6. The common emitter of the pair of emitter-coupled differential transistors Q5 and Q6 is connected to a current source constituted by a transistor Q7 and a resistor R7.

An emitter follower constituted by transistors Q11 and Q12 and a current source constituted by transistors Q13 and Q14 and resistors R13 and R14 is connected as an input buffer to the bases of the third emitter-coupled differential transistors Q5 and Q6.

A signal from an input terminal IN is input through a DC blocking capacitor C and the input buffer, and signals obtained by frequency-dividing the input signal by ½ are output to output terminals OUT.

The bases of the transistors Q11 and Q12 are connected to a power supply Vcc through base current supply resistors R11 and R12.

Figure 5:
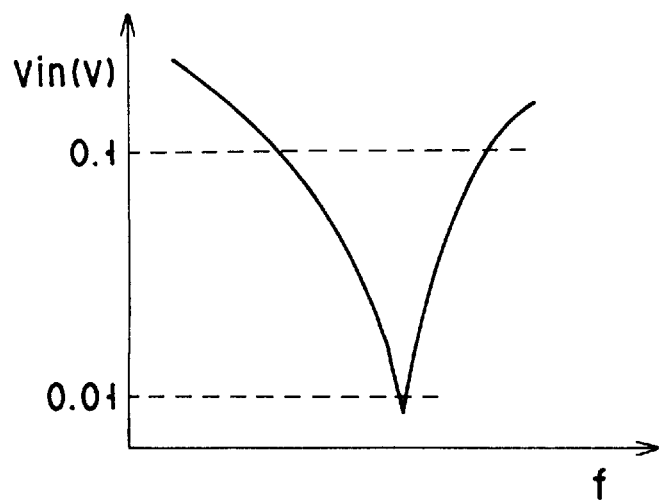
FIG. 5 is a graph showing the input voltage sensitivity characteristics of the dynamic frequency divider.

FIG. 5 shows the input voltage sensitivity characteristics of this dynamic frequency divider with respect to frequency division frequencies (the frequencies of input signals to be frequency-divided). According to the characteristics, the input voltage exhibiting the highest sensitivity is 0.01 V or lower, and frequency division can be performed in a wide range of frequencies when the input voltage is 0.1 V or higher.

Assume that the first stage of the frequency divider 29 is constituted by the dynamic frequency divider in FIG. 4, and a voltage of 0.1 V or higher is input to the frequency divider 29. In this case, if the length of the collector bias application short stub 22 is set to λ/4, and the amplitude of the collector voltage of the transistor 11 is set to 3 Vp-p, the position at which the collector bias application short stub 22 is connected (the connection position of the transmission line 27) to the input terminal of the frequency divider 29 may be set at a distance of about λ/100 from the short end of the collector bias application short stub 22.

With this arrangement, when the collector bias application short stub 22 is connected to the input terminal of the frequency divider 29 through the transmission line 27 and the DC blocking capacitor 28, the transmission line 27 increases in length on the integrated circuit pattern. Even if, therefore, the input load (stray capacitance or stray inductance) on the frequency divider 29 increases, the characteristics of the VCO 10 are hardly influenced by this increase.

As described above, in the phase locking apparatus of this embodiment, the VCO 10 and the frequency divider 29 are formed on a single integrated circuit chip, and the input terminal of the frequency divider 29 is connected to a portion near the short end of the collector bias application short stub 22 whose open end is connected to the collector of the transistor 11 which serves as the output terminal of the VCO 10.

With this arrangement, an output from the VCO 10 is hardly distributed as power to the frequency divider 29 side, but a signal voltage is transferred to the input terminal of the frequency divider 29 through the collector bias application short stub 22. Since the output power from the VCO 10 is almost supplied to only the output terminal 26 side, only small power is required.

In addition, since the VCO 10 is hardly influenced by the input load on the frequency divider 29, the VCO 10 can be designed as a single unit regardless of the frequency divider 29. Both the VCO 10 and the frequency divider 29 can therefore be optimized, contributing to an improvement in the characteristics of the phase locking apparatus.

Furthermore, in this embodiment, since the collector bias application short stub 22 of the transistor 11 in the VCO 10 also serves as a short stub for coupling the output terminal of the VCO 10 and the input terminal of the frequency divider 29, any new short stub need not be added. This can prevent an increase in chip area.

If the frequency divider 29 has a two-stage arrangement constituted by a dynamic frequency divider on the first stage and a master/slave type frequency divider on the second stage, and the dynamic frequency divider on the first stage is used in a high input voltage sensitivity region as shown in FIG. 5, the input voltage level required for the operation of the base bias power supply terminal 20 can be decreased.

With this operation, even if the input terminal of the frequency divider 29 is connected to a position near the short end of the collector bias application short stub 22 at which the voltage level is low, the frequency divider 29 can properly perform frequency division.

Another embodiment of the present invention will be described next. Note that the same reference numerals in the following embodiment denote the same parts as in FIG. 1, and only the difference points between this embodiment and the second embodiment will be described.

Second Embodiment

Figure 6:
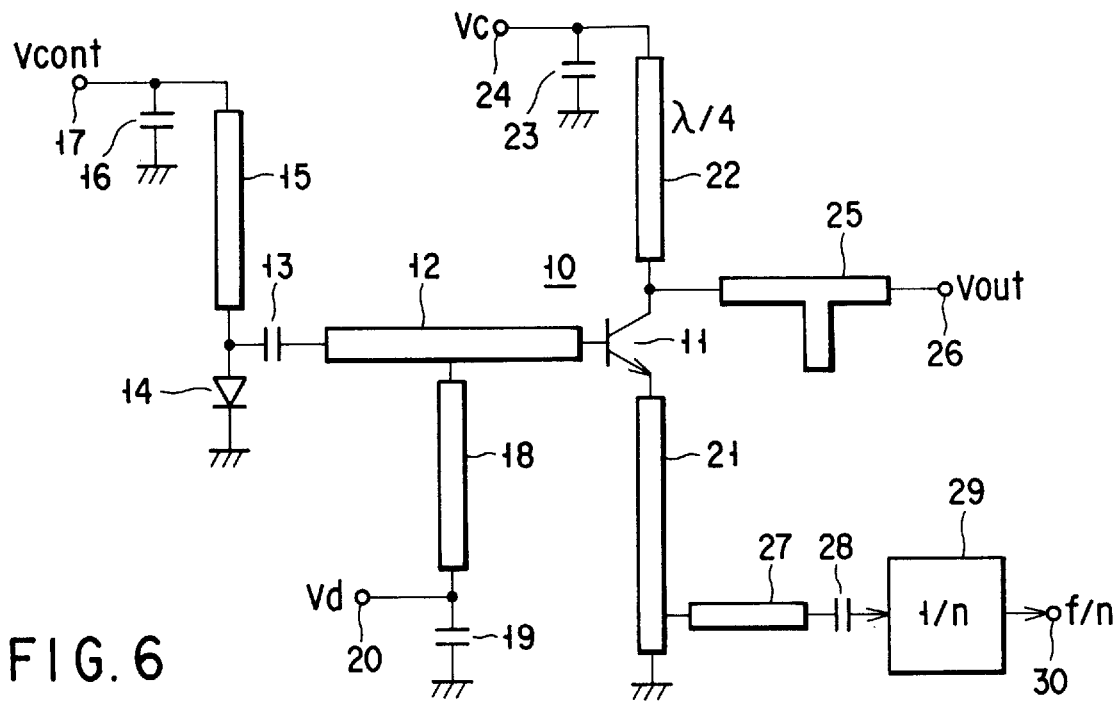
FIG. 6 is a view showing a phase locking apparatus according to the second embodiment of the present invention.

FIG. 6 shows the arrangements of a VCO, a frequency divider for frequency-dividing an output from the VCO, and their peripheral portions in a phase locking apparatus according to the second embodiment of the present invention. In this embodiment as well, at least the VCO and the frequency divider are formed within a single MIC chip.

This embodiment differs from the first embodiment in that the input terminal of a frequency divider 29 is connected to a portion near the short end (ground end) of a capacitive short stub 21 for increasing the negative resistance of a transistor 11 through a transmission line 27 and a DC blocking capacitor 28.

In this case, as in the first embodiment, the input terminal of the frequency divider 29 is preferably connected at a distance of λ/8 or less from the short end of the capacitive short stub 21.

With the arrangement of this embodiment, the same effects as those in the first embodiment can be obtained. That is, an output from the VCO 10 is hardly distributed to the frequency divider 29 side, but a signal voltage is transferred to the input terminal of the frequency divider 29 through the capacitive short stub 21. The power required for an output from the VCO 10 can be minimized.

In addition, since the VCO 10 is not influenced by the input load on the frequency divider 29, the VCO 10 can be designed as a single unit regardless of the frequency divider 29. Both the VCO 10 and the frequency divider 29 can therefore be optimized.

Furthermore, since the capacitive short stub 21 connected to the emitter of the transistor 11 of the VCO 10 also serves as a short stub for coupling the VCO 10 to the input terminal of the frequency divider 29, an increase in chip area can be prevented.

If the frequency divider 29 is formed to have a two-stage arrangement constituted by a dynamic frequency divider on the first stage and a master/slave type static frequency divider on the second stage, and the dynamic frequency divider on the first stage is used in an input voltage sensitivity region like the one shown in FIG. 5, as in the first embodiment, the input voltage level required for the operation of the frequency divider 29 can be lowered. Even if, therefore, the input terminal of the frequency divider 29 is connected to a position near the short terminal of the capacitive short stub 21 at which the voltage is lower, the frequency divider 29 can properly perform frequency division.

Third Embodiment

Figure 7:
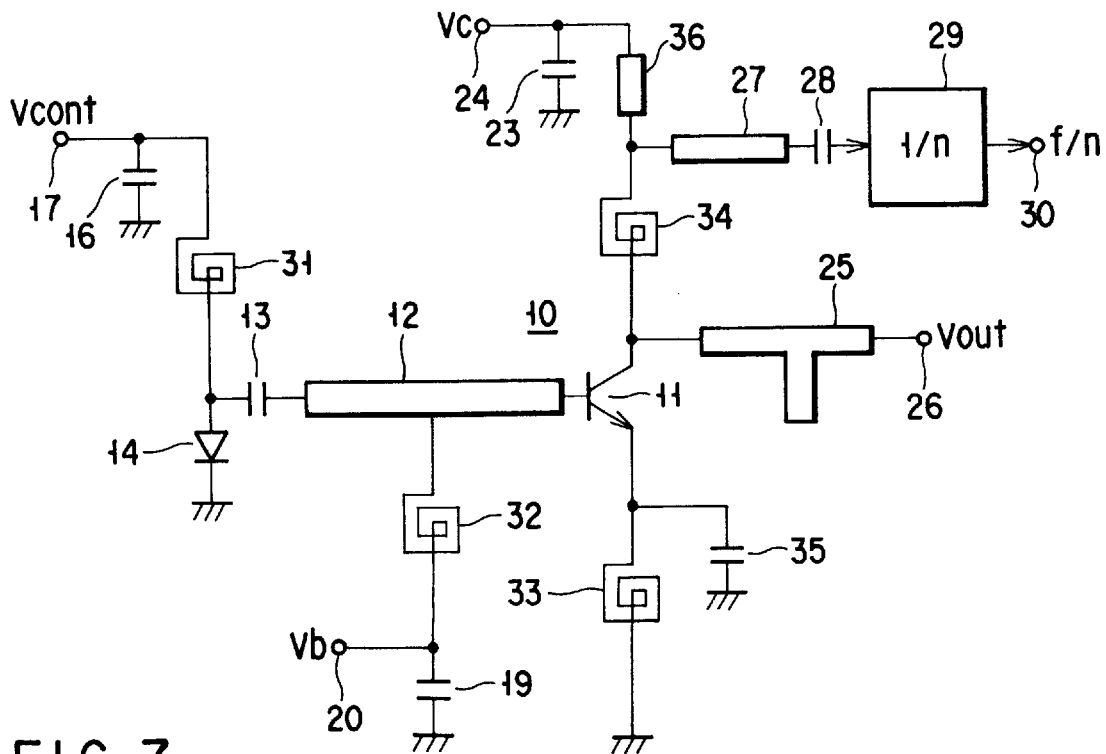
FIG. 7 is a view showing a phase locking apparatus according to the third embodiment of the present invention.

FIG. 7 shows the arrangements of a VCO, a frequency divider for frequency-dividing an output from the VCO, and their peripheral portions in a phase locking apparatus according to the third embodiment of the present invention. In this embodiment, the VCO and the frequency divider are formed in a single MIC chip, as in the first and second embodiments.

In this embodiment, the varactor bias application short stub 15, the base bias application short stub 18 for the transistor 11, the capacitive short stub 21 connected to the emitter of the transistor 11, and the collector bias application short stub 22 in FIGS. 3A and 3B are respectively replaced with spiral inductors 31, 32, 33, and 34.

In this embodiment, since the spiral inductor 33 connected to the emitter of the transistor 11 does not serve to increase the negative load on the transistor 11, the emitter of the transistor 11 is grounded through a capacitor 35 to increase the load resistance to the transistor 11.

A transmission line 36 is inserted between the collector bias application spiral inductor 34, a ground capacitor 23, and a collector bias power supply terminal 24. The input terminal of a frequency divider 29 is connected to the node between the collector bias application spiral inductor 34 and the transmission line 36 through a transmission line 27 and a DC blocking capacitor 28.

Letting λ be the wavelength at the oscillation center frequency of a voltage controlled oscillator 10, the length of the transmission line 36 is preferably set to λ/8 or less.

The present invention can also be applied to this arrangement in which a short stub is replaced with an inductance element such as a spiral inductor in this manner. According to this embodiment, the same effects as those in the first embodiment can be obtained by connecting the input terminal of the frequency divider 29 to the VCO 10 through the collector bias application spiral inductor 34 which is an inductance element.

Note that a short transmission line may be inserted between the spiral inductor 33 connected to the emitter of the transistor 11 and the ground, and the input terminal of the frequency divider 29 may be connected to the node of the transmission line and the spiral inductor 33 through the transmission line 27 and the DC blocking capacitor 28 in FIG. 7.

Fourth Embodiment

Figure 8:
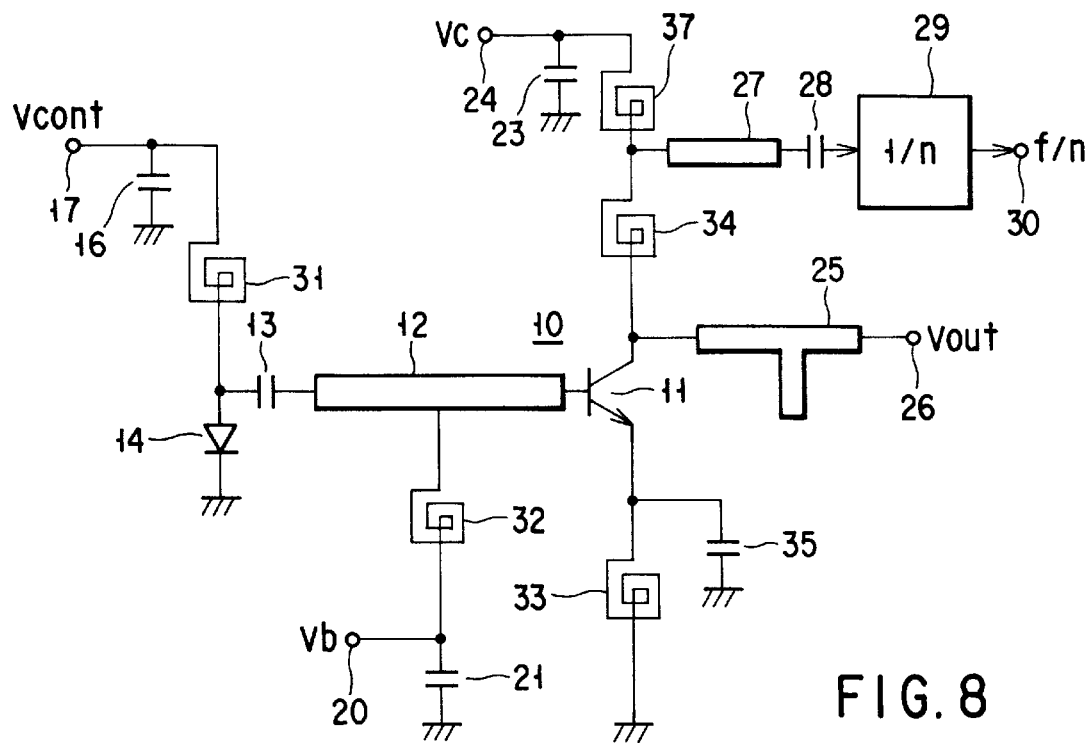
FIG. 8 is a view showing a phase locking apparatus according to the fourth embodiment of the present invention.

FIG. 8 shows the fourth embodiment of the present invention. In this embodiment, the transmission line 36 inserted between the collector bias application spiral inductor 34, the ground capacitor 23, and the collector bias power supply terminal 24 in FIG. 7 is replaced with a spiral inductor 37.

In this case, the inductance of the spiral inductor 37 is set to be smaller than that of a collector bias application spiral inductor 34. The inductance of the spiral inductor 37, in particular, is preferably set to ½ or less the inductance of the collector bias application spiral inductor 34.

Fifth Embodiment

Figure 9:
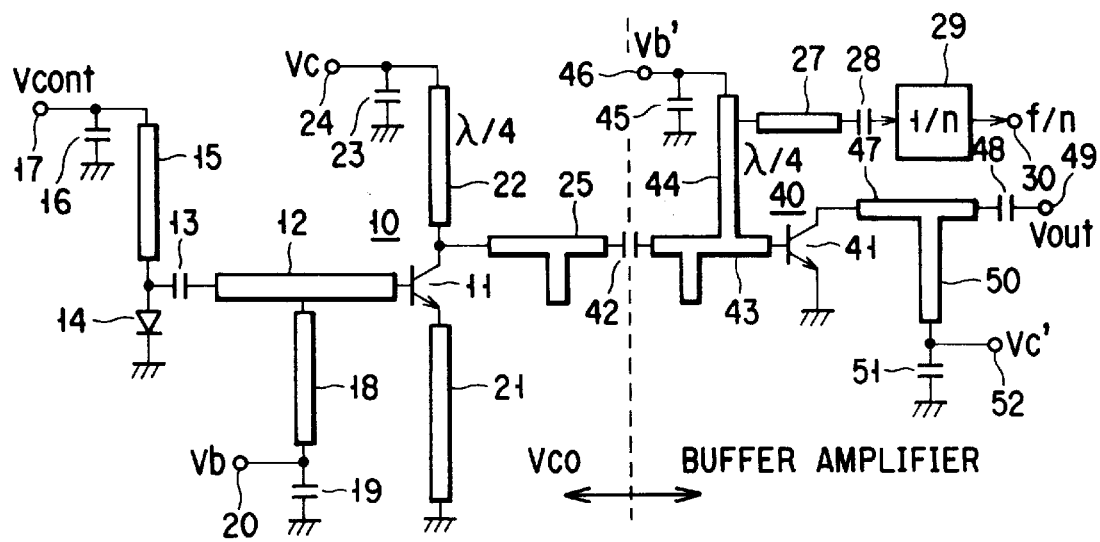
FIG. 9 is a view showing a phase locking apparatus according to the fifth embodiment of the present invention.

FIG. 9 shows an embodiment in which the present invention is applied to the arrangement in which the buffer amplifier 6 is arranged on the output side of the VCO 1 as indicated by the dashed line in FIG. 1. More specifically, FIG. 9 shows the arrangements of a VCO, a frequency divider for frequency-dividing an output from the VCO, and a buffer amplifier arranged on the output side. In this embodiment, at least the VCO, the frequency divider, and the buffer amplifier are formed in a single MIC chip.

Referring to FIG. 9, a buffer amplifier 40 is mainly constituted by a transistor 41. The base of the transistor 41 is connected to the output terminal of a VCO 10 through a DC blocking capacitor 42 and a transmission line 43.

That is, the terminal of the DC blocking capacitor 42 on the opposite side to the transmission line 43 is connected to the other end of a transmission line 25 which is used to extract an output from the VCO 10 and has one end connected to the collector of a transistor 11 of the VCO 10.

The open end of a base bias application short stub 44 is connected to a midway portion of the transmission line 43 such that the stub branches therefrom. The short end of the base bias application short stub 44 is grounded through a ground capacitor 45, and also connected to a base bias power supply terminal 46.

The emitter of the transistor 41 is grounded. The collector of the transistor 41 is connected to an output terminal 49 through a transmission line 47 for extracting an output from the buffer amplifier and a DC blocking capacitor 48.

The open end of a collector bias application short stub 50 is connected to a midway portion of the transmission line 47 such that the stub branches therefrom. The short end of the collector bias application short stub 50 is grounded through a ground capacitor 51, and also connected to a collector bias power supply terminal 52.

The input terminal of a frequency divider 29 is connected to a portion near the short end of the base bias application short stub 44 of the transistor 41 constituting the buffer amplifier 40 through a transmission line 27 and a DC blocking capacitor 28. With this arrangement, a signal having a frequency f/n, which is 1/n of an oscillation frequency f of the VCO 10, is extracted from an output terminal 30 of the frequency divider 29.

In this embodiment, as in the first embodiment described above, letting λ be the wavelength at the oscillation center frequency of the voltage controlled oscillator, the input terminal of the frequency divider 29 is preferably connected at a distance of λ/8 or less from the short end of the base bias application short stub 44.

As described above, in this embodiment, the VCO 10, the frequency divider 29, and the buffer amplifier 40 are formed on a single integrated circuit chip, and the input terminal of the frequency divider 29 is connected to a portion near the short end of the base bias application short stub 44 for the transistor 41 of the buffer amplifier 40.

With this arrangement, the same effects as those in the previous embodiments can be obtained. That is, an output from the VCO 10 is hardly distributed as power to the frequency divider 29 side, but a signal voltage is transferred to the input terminal of the frequency divider 29 through the base bias application short stub 44 for the transistor 41 of the buffer amplifier 40. The output power from the VCO 10 is supplied to only an output terminal 49 of the buffer amplifier 40. For this reason, only small power is required for an output from the VCO 10.

In addition, since the VCO 10 is not influenced by the input load on the frequency divider 29, the VCO 10 can be designed as a single unit regardless of the frequency divider 29. Both the VCO 10 and the frequency divider 29 can therefore be optimized, contributing to an improvement in the characteristics of the phase locking apparatus. In addition, since the base bias application short stub 44 for the transistor 41 of the buffer amplifier 40 also serves as an input line to the frequency divider 29, an increase in chip area can be prevented.

If the frequency divider 29 is formed to have a two-stage arrangement constituted by a dynamic frequency divider on the first stage and a master/slave type static frequency divider on the second stage, and the dynamic frequency divider on the first stage is used in an input voltage sensitivity region like the one shown in FIG. 5, as in the first embodiment, the input voltage level required for the operation of the frequency divider 29 can be lowered.

Even if, therefore, the input terminal of the frequency divider 29 is connected to a position near the short terminal of the base bias application short stub 44 at which the voltage is lower, the frequency divider 29 can properly perform frequency division.

According to still another embodiment of the present invention, the input voltage sensitivity characteristics of a frequency divider are made variable so that the oscillation frequency of a VCO can be matched with the frequency division frequency, of the frequency divider, which corresponds to the highest sensitivity.

With this operation, the input voltage required for the frequency divider can be decreased. In addition, a similar technique can be used in a wide frequency range by arbitrarily changing the input voltage sensitivity characteristics of the frequency divider. This technique can cope with even a case in which the input voltage sensitivity characteristics of the frequency divider greatly deviate from the design characteristics.

As described above, according to the phase locking apparatus of the present invention, the voltage controlled oscillator, the frequency divider, and the buffer amplifiers are formed within a single integrated circuit chip, and the input terminal of the frequency divider is connected to a position near the short end of the short stub whose open end is connected to the voltage controlled oscillator, or the input terminal of the frequency divider is connected to the voltage controlled oscillator through an inductance element, or the input terminal of the frequency divider is connected to a portion near the short end of the bias application short stub for the buffer amplifier. With this arrangement, the output power of the voltage controlled oscillator can be decreased while high performance is maintained. In addition, this arrangement requires neither a hybrid circuit nor a power divider for distributing output power from the voltage controlled oscillator to the output side and the frequency divider side.

According to the arrangement of the present invention, an output from the voltage controlled oscillator is hardly distributed to the frequency divider side, but a signal voltage is reliably transferred to the frequency divider. The frequency divider can be operated without increasing the output power of the voltage controlled oscillator.

In addition, since the voltage controlled oscillator is not influenced by the input load on the frequency divider, the voltage controlled oscillator can be designed as a single unit independently of the frequency divider. Both the voltage controlled oscillator and the frequency divider can be optimized, and the performance of the phase locking apparatus can be improved.

Furthermore, if the frequency divider is formed to have a two-stage arrangement constituted by a dynamic frequency divider on the first stage and a master/slave type static frequency divider on the second stage, and the dynamic frequency divider on the first stage is used in a high input voltage sensitivity region, the input voltage level required for the operation of the frequency divider can be lowered. For this reason, as in the present invention, even if the input terminal of the frequency divider is connected to a position at which the voltage level is low, the frequency divider can easily perform frequency division.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A phase locking apparatus comprising:
a voltage controlled oscillator;
a frequency divider for frequency-dividing an output from said voltage controlled oscillator;
a phase comparator for comparing an output from said frequency divider with a phase of a reference signal; and
control means for controlling an oscillator frequency of said voltage controlled oscillator on the basis of an output from said phase comparator,
wherein said voltage controlled oscillator and said frequency divider are formed within a single integrated circuit chip, and an input terminal of said frequency divider is connected to a short stub having an open end connected to said voltage controlled oscillator.

2. An apparatus according to claim 1, further comprising a buffer amplifier for amplifying an output from said voltage controlled oscillator,
wherein said short stub is a short stub for applying a bias to said buffer amplifier.

3. An apparatus according to claim 1, wherein the input terminal of said frequency divider is connected at a distance of not more than $\lambda/8$ from a short end of said short stub when a wavelength at an oscillation center frequency of said voltage controlled oscillator is represented by $\lambda$.

4. An apparatus according to claim 1, wherein said short stub is grounded through a capacitor.

5. An apparatus according to claim 1, wherein said short stub has a length of $\lambda/4$ when a wavelength at an oscillation center frequency of said voltage controlled oscillator is represented by $\lambda$.

6. An apparatus according to claim 1, further comprising a capacitor for cutting off a DC component of an output from said voltage controlled oscillator.

7. An apparatus according to claim 1, wherein said short stub has a length of $3\lambda/8$ when a wavelength at an oscillation center frequency of said voltage controlled oscillator is represented by $\lambda$.

8. A phase locking apparatus comprising:
a voltage controlled oscillator;
a frequency divider for frequency-dividing an output from said voltage controlled oscillator;
a phase comparator for comparing an output from said frequency divider with a phase of a reference signal; and
control means for controlling an oscillator frequency of said voltage controlled oscillator on the basis of an output from said phase comparator,
wherein said voltage controlled oscillator and said frequency divider are formed within a single integrated circuit chip, and are connected to said voltage controlled oscillator through a first inductance element.

9. An apparatus according to claim 8, further comprising a transmission line having one end connected to said first inductance element and the other end grounded.

10. An apparatus according to claim 9, wherein the other end of said transmission line is grounded through a DC blocking capacitor.

11. An apparatus according to claim 9, wherein said transmission line has a length of not more than $\lambda/8$ when a wavelength at an oscillation center frequency of said voltage controlled oscillator is represented by $\lambda$.

12. An apparatus according to claim 8, further comprising a capacitor for cutting off a DC component of an output from said voltage controlled oscillator.

13. An apparatus according to claim 8, further comprising a second inductance element having one end connected to said first inductance element and the other end grounded.

14. A phase locking apparatus comprising:
a voltage controlled oscillator;
a frequency divider for frequency-dividing an output from said voltage controlled oscillator;
a phase comparator for comparing an output from said frequency divider with a phase of a reference signal; and control means for controlling an oscillator frequency of said voltage controlled oscillator on the basis of an output from said phase comparator, wherein said voltage controlled oscillator and said frequency divider are formed within a single integrated circuit chip, and an input terminal of said frequency divider is connected to a position at which variations in impedance on the frequency divider side are suppresses when viewed from an amplifier of said voltage controlled oscillator.

* * * * *